United States Patent
Tsuji

(10) Patent No.: US 6,818,505 B2
(45) Date of Patent: Nov. 16, 2004

(54) NON-VOLATILE SEMICONDUCTOR MEMORY DEVICE AND MANUFACTURING METHOD THEREOF

(75) Inventor: Naoki Tsuji, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 71 days.

(21) Appl. No.: 10/135,443

(22) Filed: May 1, 2002

(65) Prior Publication Data

US 2003/0013254 A1 Jan. 16, 2003

(30) Foreign Application Priority Data

Jul. 16, 2001 (JP) ........................................ 2001-215360

(51) Int. Cl.$^7$ ......................................... H01L 21/8238
(52) U.S. Cl. ..................... 438/257; 257/315; 438/593
(58) Field of Search ................................ 438/257, 593, 438/201, 211, FOR 203; 257/315, 239, 261

(56) References Cited

U.S. PATENT DOCUMENTS

| | | | | |
|---|---|---|---|---|
| 5,047,362 A | * | 9/1991 | Bergemont ................. | 438/257 |
| 5,306,935 A | * | 4/1994 | Esquivel et al. ............ | 257/315 |
| 5,684,739 A | * | 11/1997 | Takeuchi ............... | 365/185.03 |
| 5,793,078 A | * | 8/1998 | Takeuchi ................... | 257/315 |
| 5,923,063 A | * | 7/1999 | Liu et al. ................... | 257/316 |
| 5,940,704 A | * | 8/1999 | Takeuchi .................... | 438/257 |
| 5,960,265 A | * | 9/1999 | Acovic et al. .............. | 438/157 |
| 5,985,720 A | * | 11/1999 | Saitoh ........................ | 438/266 |
| 6,018,195 A | * | 1/2000 | Takebuchi .................. | 257/752 |
| 6,469,338 B2 | * | 10/2002 | Kobayashi et al. ......... | 257/315 |
| 6,501,125 B2 | * | 12/2002 | Kobayashi .................. | 257/317 |
| 2002/0005546 A1 | * | 1/2002 | Kawata ....................... | 257/316 |

* cited by examiner

*Primary Examiner*—George Fourson
*Assistant Examiner*—Joannie Adelle Garcia
(74) *Attorney, Agent, or Firm*—McDermott, Will & Emery

(57) ABSTRACT

In a non-volatile semiconductor memory device, three-layered structure of the first, second and third floating gate electrodes is implemented, and stepped portions are provided on the first interlayer insulating film surrounding the first floating gate electrode. The position of the bottom surface of the second floating gate electrode can be disposed higher than that of the upper surface of the first floating gate electrode. Consequently, compared with overlapping area of the floating gate electrode with a control gate electrode in a conventional non-volatile semiconductor device, it can be increased by the length of stepped portions on the first interlayer insulating film. Film thickness as floating gate electrode will not be as thick as conventional structures. Overlapping area of the floating gate electrode with the control gate electrode can be sufficiently secured without a portion with the maximum film thickness of floating gate electrode being larger.

19 Claims, 9 Drawing Sheets

NON-VOLATILE SEMICONDUCTOR MEMORY DEVICE AND MANUFACTURING METHOD THEREOF

BACKGROUND OF THE INVENTION

1. Field of the Invention

The present invention relates to a non-volatile semiconductor memory device and a manufacturing method thereof, and more particularly to the improvement of structures of a non-volatile semiconductor memory device.

2. Description of the Background Art

Conventionally, in a stacked gate type non-volatile semiconductor memory device having a floating gate electrode and a control gate electrode, in order to improve the performance thereof, capacity between the floating gate electrode and the control gate electrode needed to be sufficiently larger than that between the floating gate electrode and a substrate. The performance of a semiconductor device as used herein means that the voltage in data writing and erasure is lowered, or writing and erasing time is shortened.

The capacity between the floating gate electrode and the control gate electrode is roughly determined by overlapping area of the floating gate electrode with the control gate electrode and thickness of an insulating film (usually a stacked film composed of what is called ONO film of oxide film/nitride film/oxide film) between the floating gate electrode and the control gate electrode. Insulating film should be made thin to increase the capacity between the floating gate electrode and the control gate electrode. In order to retain the charges stored in the floating gate electrode, however, the film cannot be made too thin. In addition, as cell size is reduced, with conventional structures, it is becoming difficult to secure sufficient overlapping area of the floating gate electrode with the control gate electrode.

FIG. 17 shows a cross-sectional structure of a conventional AND type non-volatile semiconductor memory device. In a prescribed position on the main surface of semiconductor substrate 20, element-isolating regions 1 are formed with a prescribed spacing to define an active region. In the active region, T-shaped floating gates 3, 7 made of polysilicon (polycrystalline silicon) film are provided on the main surface of semiconductor substrate 20, with a gate insulating film 2 interposed. Floating gate electrode 3 is provided in such a way that it is embedded in interlayer insulating film 6, and floating gate electrode 7 contacts floating gate electrode 3 and is provided in a prescribed pattern on interlayer insulating film 6. Provided on floating gate electrode 7 is insulating film (ONO film) 9, on which control gate electrode 12 is provided. Interlayer insulating film 14 is provided thereon. Floating gate electrode is in T-shape so that the overlapping area of the floating gate electrode with the control gate electrode is sufficiently secured.

Meanwhile, reduction of cell size consequently causes securable overlapping length (dimension a in FIG. 17) in transverse direction to be shortened and overlapping area to be reduced. Accordingly, in the case cell size reduces, in order to increase overlapping area to secure capacity between the floating gate electrode and the control gate electrode, a method in which film thickness (shown as b in the figure) of floating gate electrode 7 extending transversely is increased, as shown in a cross-sectional view of FIG. 18, to increase overlapping area on the side surface has been adopted (a+2×b in the figure is overlapping length, word line width (in a direction of depth) is overlapping width, and thus overlapping area=overlapping length×overlapping width).

When film thickness (shown as b in the figure) of floating gate electrode 7 extending transversely is increased, polysilicon film thickness (shown as c in the figure) from the upper surface of gate oxide film 2 to the lower surface of insulating film 9 is consequently increased. In etching in a direction of word line (left-to-right direction in the figure), the portion with the maximum film thickness of this polysilicon film must be infallibly etched. However, when etching period is long, a problem will arise that word line may also be etched transversely (in a direction perpendicular to the sheet surface) to cause word line width to be smaller.

In addition, since film thickness of gate oxide film 2 provided below floating gate electrode 3 made of polysilicon is small, there is a limitation for overetching time and time control thereof is difficult. Therefore, gate oxide film 2 tends to be etched as far as Si substrate, or generation of polysilicon residue is likely.

SUMMARY OF THE INVENTION

An object of the present invention is to provide a non-volatile semiconductor memory device and a manufacturing method thereof which allows overlapping area of a floating gate electrode with a control gate electrode to be sufficiently secured while not enlarging a portion with the maximum film thickness of the floating gate electrode made of polysilicon.

A non-volatile semiconductor device according to the present invention includes: a semiconductor substrate; a gate insulating film provided on a main surface of the semiconductor substrate; an interlayer insulating film provided on the gate insulating film; a first floating gate electrode provided to be in contact with the gate insulating film and embedded in the interlayer insulating film with an upper surface only being exposed; a second floating gate electrode provided on the interlayer insulating film; a third floating gate electrode provided to cover the first floating gate electrode, the second floating gate electrode and the interlayer insulating film so as to electrically connect the first floating gate electrode and the second floating gate electrode; an insulating film provided to cover the third floating gate electrode; and a control gate electrode provided to cover the insulating film; wherein the second floating gate electrode has a bottom surface positioned to be higher than an upper surface of the first floating gate electrode.

In addition, a method of manufacturing a non-volatile semiconductor device according to the present invention includes the steps of: forming a gate insulating film on a main surface of a semiconductor substrate; forming on the gate insulating film a first floating gate electrode having a periphery surrounded by an interlayer insulating film; forming a semiconductor layer on upper surfaces of the interlayer insulating film and the first floating gate electrode; etching the floating gate electrode and the semiconductor layer so as to position the upper surface of the first floating gate electrode to be lower than the upper surface of the interlayer insulating film and to have the semiconductor layer left solely on the upper surface of the interlayer insulating film, and forming a second floating gate electrode with remaining semiconductor layer; forming a third floating gate electrode to cover the first floating gate electrode, the interlayer insulating film and the second floating gate electrode; forming an insulating film to cover the third floating gate electrode; and forming a control gate electrode to cover the insulating film.

According to the non-volatile semiconductor device and the manufacturing method thereof, by disposing the bottom surface of the second floating gate electrode to be higher than the upper surface of the first floating gate electrode, three-layered structure of the first floating gate electrode located below, the second floating gate electrode located above and the third floating gate electrode coupling the first floating gate electrode and the second floating gate electrode is implemented. In addition, by disposing the first floating gate electrode and the second floating gate electrode at positions different in a direction of height, an inclined portion can be produced in the third floating gate electrode. As a result, contact length of the floating gate electrode with the control gate electrode is extended, and overlapping area of the floating gate electrode with the control gate electrode can be increased.

Further in the present invention of the non-volatile semiconductor device, preferably, the interlayer insulating film is provided with a flat surface which is substantially as high as the upper surface of the first floating gate electrode.

Moreover in the present invention of the non-volatile semiconductor device, preferably, the interlayer insulating film is provided with an inclined surface extending from the upper end portion of the first floating gate electrode to the upper surface of the first interlayer insulating film. According to this configuration, the second floating gate electrode is sufficiently distanced from a diffused layer interconnection region provided on the semiconductor substrate. Therefore, lowering of the coupling ratio of the non-volatile semiconductor device due to the increase of parasitic capacitance between the second floating gate electrode and the diffused layer interconnection region can be prevented.

Further in the present invention of the non-volatile semiconductor device, preferably, the first floating gate electrode and the second floating gate electrode are positioned spaced apart, and the third floating gate electrode is provided to establish electrical connection between the first floating gate electrode and the second floating gate electrode.

With this configuration, film thickness as a floating gate electrode will not be as large as in a conventional structures. As a result, overlapping area of the floating gate electrode with the control gate electrode can be sufficiently secured without a portion with the maximum film thickness of the floating gate electrode being enlarged.

In addition in the present invention of the non-volatile semiconductor device and the manufacturing method thereof, preferably, the second floating gate electrode has a film thickness smaller than that of the first floating gate electrode. Thus, in etching the floating gate electrode in a word line direction, it will be possible to avoid excessive overetching of the thin gate oxide film.

In the present invention of the non-volatile semiconductor device, preferably, the third floating gate electrode is composed of silicon containing an n-type impurity.

Moreover in the present invention of the non-volatile semiconductor device and the manufacturing method thereof, preferably, the third floating gate electrode contains a larger amount of the n-type impurity than the first floating gate electrode. Thus, by diffusing impurity from the third floating gate electrode toward the first floating gate electrode, concentration of the first floating gate electrode with low impurity concentration is increased, and depletion due to the applied voltage in cell operation can be prevented.

In addition in the present invention of the non-volatile semiconductor device and the manufacturing method thereof, preferably, the second floating gate electrode contains a larger amount of the n-type impurity than the first floating gate electrode. Thus, by diffusing impurity from the second floating gate electrode, low impurity concentration of the first floating gate electrode is increased and depletion when a voltage is applied in cell operation can be prevented.

Further in the present invention of the method of manufacturing a non-volatile semiconductor device, preferably, in the step of forming the second floating gate electrode, an etchant having selective etching rate 1:1 in etching the first floating gate electrode and the interlayer insulating film is used for etching the first floating gate electrode and the semiconductor layer. Thus, a flat surface which is substantially as high as the upper surface of the first floating gate electrode can be formed on the interlayer insulating film.

In addition in the present invention of the method of manufacturing a non-volatile semiconductor device, preferably, in the step of forming the second floating gate electrode, an etchant having selective etching rate 5:1 or higher in etching the first floating gate electrode and the interlayer insulating film is used for etching the first floating gate electrode and the semiconductor layer. Thus, an inclined surface which extends from the upper end portion of the first floating gate electrode to the upper surface of the first interlayer insulating film can be formed.

Moreover in the present invention of the method of manufacturing a non-volatile semiconductor device, preferably, the first floating gate electrode, the second floating gate electrode and the third floating gate electrode are of amorphous silicon.

Further in the present invention of the method of manufacturing a non-volatile semiconductor device, preferably, the first floating gate electrode, the second floating gate electrode and the third floating gate electrode are of polysilicon.

In the present invention of the method of manufacturing a non-volatile semiconductor device, preferably, the interlayer insulating film is CVD oxide film.

In the method of manufacturing a non-volatile semiconductor device of the present invention preferably further includes the step of forming a word line, and after removing the third, second and first floating gate electrode material deposited in an opening formed in the word line, removing the first floating gate electrode material remaining on the bottom surface portion of the opening. Preferably, dilute ammonia solution is used for removing the first floating gate electrode material remaining on the bottom surface portion of the opening. Thus, removal of the floating gate electrode material remaining on the bottom surface portion in the opening can be ensured.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, the structure of a non-volatile semiconductor device and a manufacturing method thereof in each embodiment of the present invention will be described with reference to the figures.

(First Embodiment)

First, the structure of a non-volatile semiconductor device and a manufacturing method thereof in the present embodiment will be described with reference to FIGS. 1 to 9. A non-volatile semiconductor device in the present embodiment is an AND type flash memory, FIG. 1 is a cross-sectional view showing the structure of the non-volatile semiconductor device in the present embodiment, and FIGS. 2 to 9 are cross-sectional views showing the manufacturing method thereof.

(Structure of Non-Volatile Semiconductor Device)

Figure 1:
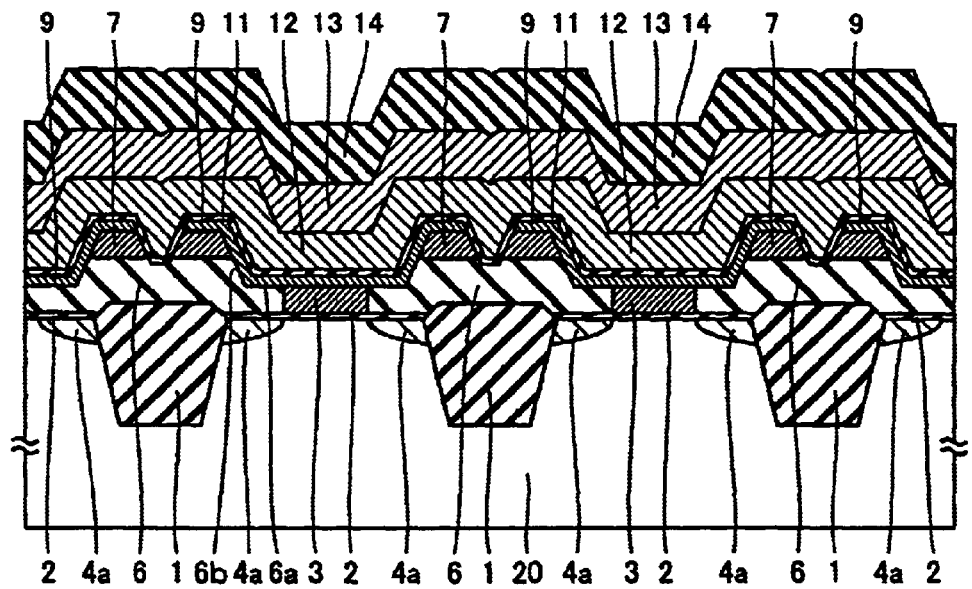
FIG. 1 is a cross-sectional view showing the structure of a non-volatile semiconductor device in first embodiment according to the present invention.

Referring to FIG. 1, an element-isolating region 1 is provided so as to define an active region in a prescribed position on silicon substrate 20 which is a semiconductor substrate. Gate insulating film 2 is provided on the main surface of silicon substrate 20. Provided on gate insulating film 2 are first interlayer insulating film 6 and first floating gate electrode 3 which contacts gate insulating film 2 and is embedded in first interlayer insulating film 6 to expose only its upper surface. On first interlayer insulating film 6 surrounding first floating gate electrode 3, flat surface 6a which is as high as the upper surface of first floating gate electrode 3, and inclined surface 6b extending from the end portion of flat surface 6a to the upper surface of first interlayer insulating film 6 are provided. The upper surface of first interlayer insulating film 6 positioned above element-isolating region 1 is positioned to be higher than the upper surface of first floating gate electrode 3. Provided on the upper surface of first interlayer insulating film 6 positioned above element-isolating region 1 is second floating gate electrode 7 isolated with a prescribed spacing in a word line direction. Consequently, the bottom surface of second floating gate electrode 7 is positioned to be higher than the upper surface of first floating gate electrode 3.

On the upper surface of first floating gate electrode 3, second floating gate electrode 7 and interlayer insulating film 6, third floating gate electrode 9 for electrically connecting first floating gate electrode 3 with second floating gate electrode 7 is continuousy provided between first floating gate electrode 3 and second floating gate electrode 7. Insulating film 11 continuous in a word line direction is provided on the upper surface of this third floating gate electrode 9. In addition, first and second control gate electrodes 12, 13 are provided on and along insulating film 11. Second interlayer insulating film 14 is further provided on and along second control gate electrode 13.

(Method of Manufacturing Non-Volatile Semiconductor Memory Device)

Figure 2:
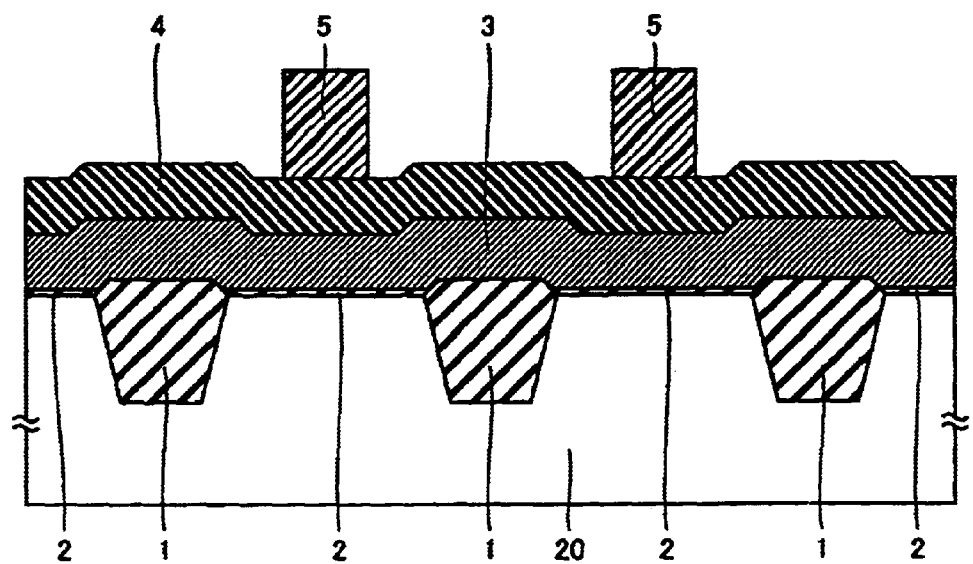
FIGS. 2 to 9 are the first to eighth cross-sectional views showing the steps of manufacturing of the non-volatile semiconductor device in the first embodiment according to the present invention.

A method of manufacturing a non-volatile semiconductor memory device with above-mentioned structures will be described with reference to FIGS. 2 to 9. Referring first to FIG. 2, a trench is formed on the surface of silicon substrate 20 through dry etching. Thereafter element-isolating region 1 composed of SiO2 and the like is formed in the trench with a method such as CVD (Chemical Vapor Deposition). Gate insulating film 2 composed of thermal oxide film with a film thickness of approximately 8.5 nm is then formed on the main surface of silicon substrate 20. First phosphorus-doped amorphous silicon film 3 whose film thickness is approximately 150 nm and impurity concentration is approximately $1 \times 10^{20}/cm^3$ is then deposited on gate insulating film 2. Silicon nitride film 4 approximately 200 nm in thickness is further deposited on first phosphorus-doped amorphous silicon film 3.

Considering the electrical operation of cells, in order to avoid depletion when a voltage is applied, it is desirable here that concentration of phosphorus in first phosphorus-doped amorphous silicon film 3 is sufficiently higher than $1 \times 10^{20}/cm^3$. When concentration of phosphorus is increased, however, thermal phosphoric acid is diffused in first phosphorus-doped amorphous silicon film 3 in thermal phosphoric acid treatment in the subsequent process flow. This will adversely affect gate oxide film 2 positioned below first phosphorus-doped amorphous silicon film 3. Therefore, in terms of the electrical characteristics of cells, higher concentration of phosphorus is desirable, though cannot be higher than $1 \times 10^{20}/cm^3$.

Next, in a position corresponding to the region on silicon nitride film 4, where the first floating gate electrode will be formed, photoresist film 5 having a prescribed pattern is formed with photolithographic technique. Thereafter, using this photoresist film 5 as a mask, silicon nitride film 4 is patterned through anisotropic etching. As a peripheral circuit region is covered with photoresist film 5 here, silicon nitride film 4 therein is not etched. The peripheral circuit region is not shown.

Figure 3:
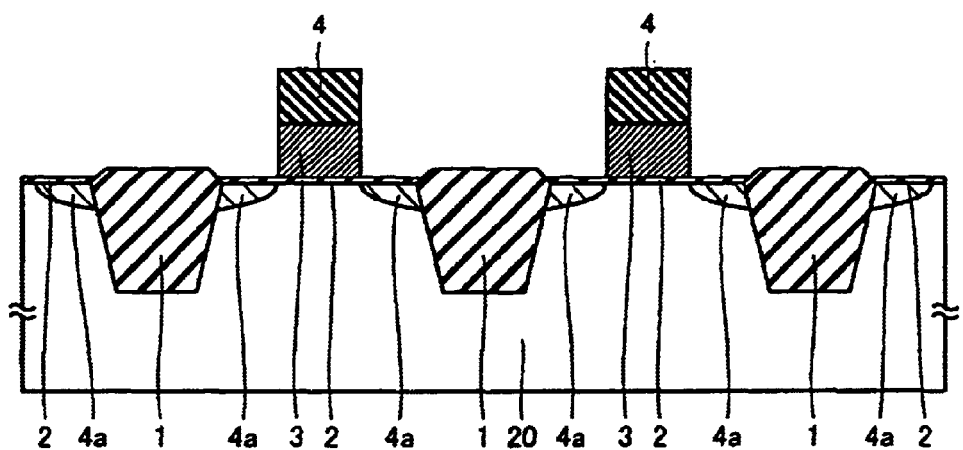

Referring next to FIG. 3, after photoresist film 5 is removed, using patterned silicon nitride film 4 as a mask, first phosphorus-doped amorphous silicon film 3 is patterned through anisotropic etching. Here again in this etching process, the peripheral circuit region is not etched because it is entirely covered with silicon nitride film 4.

Thereafter, using patterned first phosphorus-doped amorphous silicon film 3 as a mask, arsenic (As) is implanted into silicon substrate 20 by the amount of approximately $1 \times 10^{13}/cm^2$ with ion implantation method to form source/drain regions 4a. Though not illustrated, a method can be adopted in which, after a sidewall is formed on the side surface of first phosphorus-doped amorphous silicon 3, using the sidewall and first phosphorus-doped amorphous silicon film 3 as a mask, arsenic is implanted into silicon substrate 20 by the amount of approximately $2 \times 10^{15}/cm^2$ with ion implantation method to form source/drain regions with LDD structure.

Figure 4:
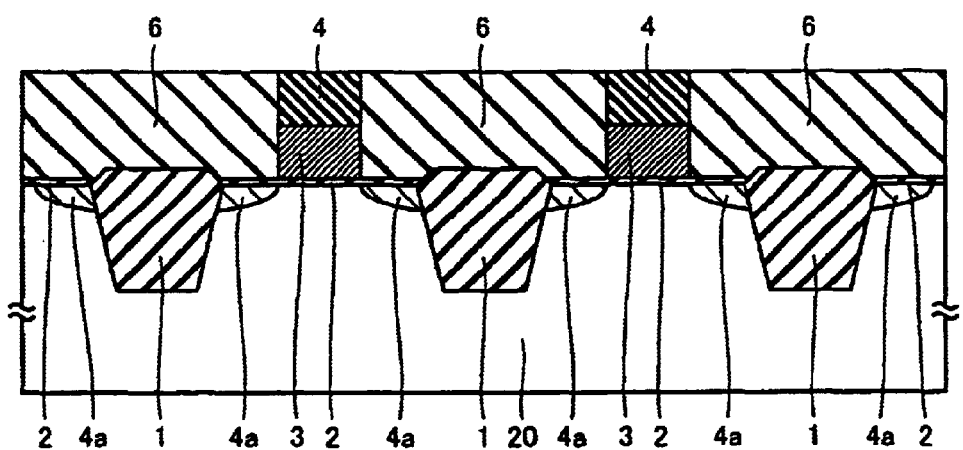

Referring next to FIG. 4, on the entire surface of silicon substrate 20, first interlayer insulating film 6 composed of TEOS oxide film is deposited with CVD to a thickness of approximately 500 nm. The surface of first interlayer insulating film 6 is then planarized with CMP (Chemical Mechanical Polishing) method until silicon nitride film 4 is exposed.

Figure 5:
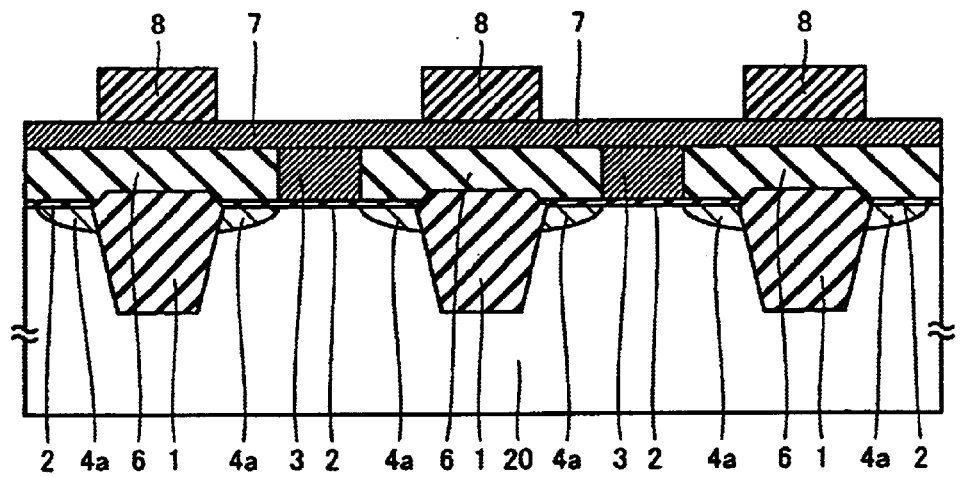

Referring next to FIG. 5, first interlayer insulating film 6 and silicon nitride film 4 are simultaneously dry-etched-back by approximately 150 nm. Silicon nitride film 4 is not completely etched away with this dry-etching-back. After dry-etching-back, silicon nitride film 4 on first phosphorus-doped amorphous silicon film 3 is completely removed with thermal phosphoric acid, and the surface of first phosphorus-doped amorphous silicon film 3 is exposed. Here, the upper surface of first phosphorus-doped amorphous silicon film 3 is almost as high as that of first interlayer insulating film 6 surrounding its periphery.

After hydrofluoric acid is used to remove native oxide formed on the upper surface of exposed first phosphorus-doped amorphous silicon film 3, second phosphorus-doped amorphous silicon film 7 having impurity concentration of approximately $4 \times 10^{20}/cm^3$ is then deposited to a thickness of approximately 75 nm on the upper surface of first interlayer insulating film 6 and first p-doped amorphous silicon film 3.

The deposited film thickness of second phosphorus-doped amorphous silicon film 7 is preferably smaller than that of first phosphorus-doped amorphous silicon film 3 (150 nm) described with respect to the step shown in FIG. 2.

The reason for this is as follows. Both first phosphorus-doped amorphous silicon film 3 and second phosphorus-doped amorphous silicon film 7 have to be simultaneously removed in etching the floating gate electrode in a word line direction. Therefore, it is preferred in etching that second phosphorus-doped amorphous silicon film 7, which is present on first interlayer insulating film 6 with a film thickness of approximately 150 nm positioned on source/drain regions 4a, is thinner than first phosphorus-doped amorphous silicon film 3, which is present on gate oxide film 2 with a film thickness of approximately 8.5 nm. Though film thickness of first interlayer insulating film 6 at deposition is approximately 500 nm, the same after processing is approximately 150 nm. In other words, if gate oxide film 2 small in film thickness is overetched, etchant will penetrate gate oxide film 2 acting as an etching stopper, resulting in undesirable etching of silicon substrate 20.

In addition, concentration of phosphorus in second phosphorus-doped amorphous silicon film 7 is set to be higher than that in first phosphorus-doped amorphous silicon film 3 so that, by diffusing phosphorus from second phosphorus-doped amorphous silicon film 7, the low impurity concentration in first phosphorus-doped amorphous silicon film 3 is increased and that depletion when voltage is applied in cell operation is prevented.

As mentioned above, impurity concentration in first phosphorus-doped amorphous silicon film 3 was not set to be high from the beginning. Therefore, in this process, as thermal phosphoric acid treatment has already been completed, no problem will arise even though concentration of first phosphorus-doped amorphous silicon film 3 becomes higher due to the diffusion phenomenon.

Figure 6:
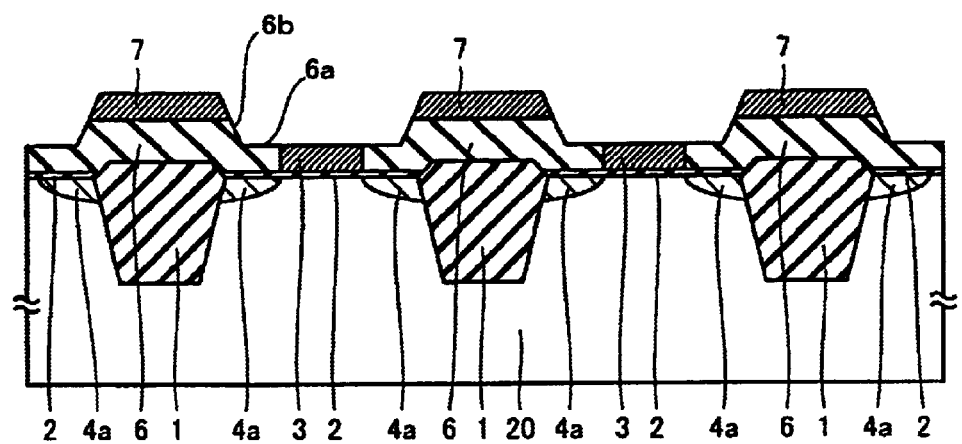

Referring again to FIG. 5, photoresist film 8 is formed on second phosphorus-doped amorphous silicon film 7 such that the upper part of the active region is opened and the upper part of element-isolating region 1 is left as it is. Referring next to FIG. 6, using this photoresist film 8 as a mask, second phosphorus-doped amorphous silicon film 7 and first phosphorus-doped amorphous silicon film 3 are etched by approximately 150 nm through dry etching process. Thus, second phosphorus-doped amorphous silicon film 7 in the memory cell portion is removed, and also first phosphorus-doped amorphous silicon film 3 is etched by about one half of its thickness.

Consequently, first floating gate electrode 3 composed of first phosphorus-doped amorphous silicon film is completed. In this dry etching process, an etchant of which selective etching rate for the phosphorus-doped amorphous silicon film and first interlayer insulating film 6 is 1:1 is used. Photoresist film 8 is removed thereafter.

Accordingly, as shown in FIG. 6, first floating gate electrode 3 and first interlayer insulating film 6 are simultaneously etched. Flat surface 6a as high as the upper surface of first floating gate electrode 3 and inclined surface 6b extending from the end portion of flat surface 6a to the upper surface of first interlayer insulating film 6 are provided on first interlayer insulating film 6.

As the upper surface of first interlayer insulating film 6 positioned above element-isolating region 1 is covered with photomask, it is not etched and is positioned to be higher than the upper surface of first floating gate electrode 3. Though not illustrated, the peripheral circuit region is covered with photoresist film 8 so that it will not be etched. In this etching process, though photoresist film 8 is used to form a pattern having the upper region of first floating gate electrode 3 in the memory cell portion opened, other process can be adopted, in which, for example, nitride film is patterned in above-mentioned manner to etch phosphorus-doped amorphous silicon film with nitride film mask, and then to remove the nitride film mask with thermal phosphoric acid. Therefore, photomask is not limited to photoresist film.

Figure 7:
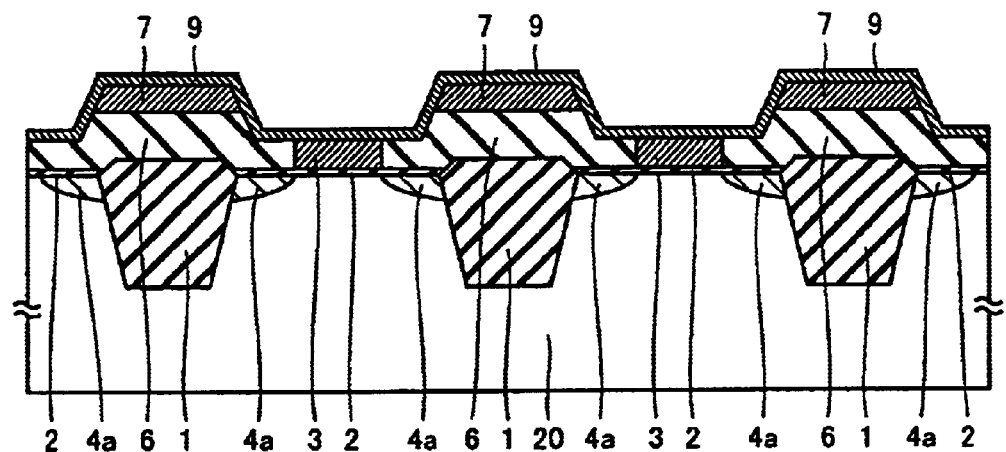

Referring next to FIG. 7, after the native oxide formed on the upper surface of first floating gate electrode 3 and second phosphorus-doped amorphous silicon film 7 is removed through HF treatment, third phosphorus-doped amorphous silicon film 9 with a film thickness of approximately 20 nm is deposited. Thus, first floating gate electrode 3 and second phosphorus-doped amorphous silicon film 7 are electrically connected. Impurity concentration of third phosphorus-doped amorphous silicon film 9 is approximately $4 \times 10^{20}/cm^3$, which is set to be higher than that of first phosphorus-doped amorphous silicon film 3 so that, by diffusing phosphorus from third phosphorus-doped amorphous silicon film 9 toward first floating gate electrode 3, the low impurity concentration in first floating gate electrode 3 is increased and depletion when voltage is applied in cell operation is prevented.

Figure 8:
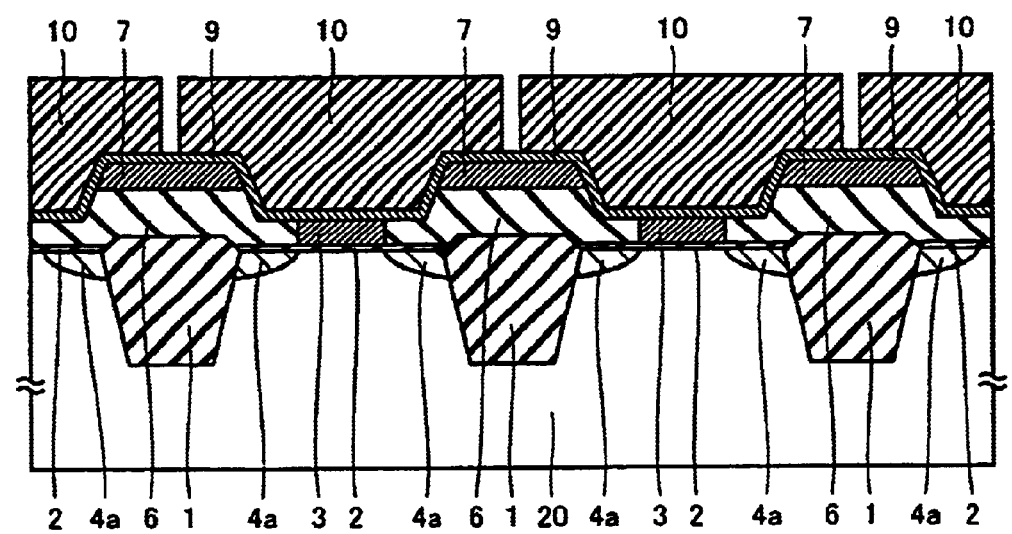
Figure 9:
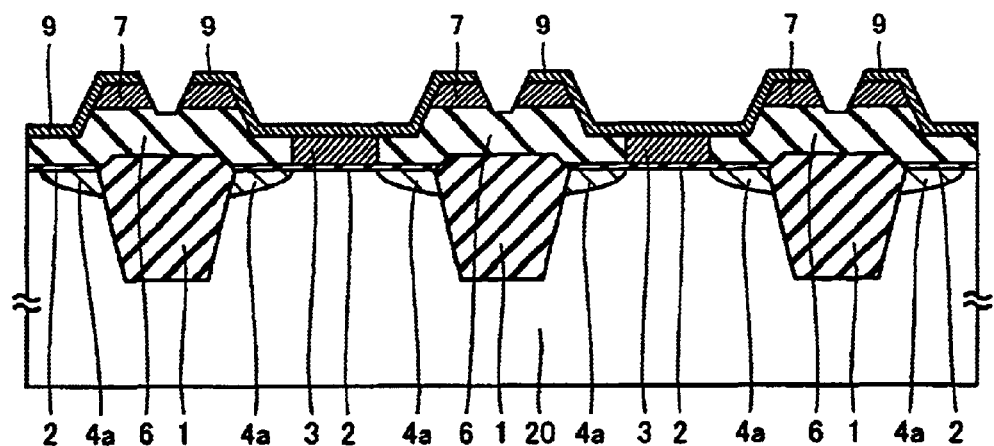

Referring next to FIG. 8, photoresist film 10 having an opening in the approximately central region of second phosphorus-doped amorphous silicon film 7 in the memory cell portion is formed. Referring next to FIG. 9, using photoresist film 10 as a mask, third phosphorus-doped amorphous silicon film 9 and the second phosphorus-doped amorphous silicon film 7 are dry etched. Etching is stopped at first interlayer insulating film 6. Thus, third phosphorus-doped amorphous silicon film 9 and second phosphorus-doped amorphous silicon film 7 are interrupted on the isolation, so that one direction of second floating gate electrode 7 and third floating gate electrode 9 is completed. Photoresist film 10 is removed thereafter.

Figure 10:
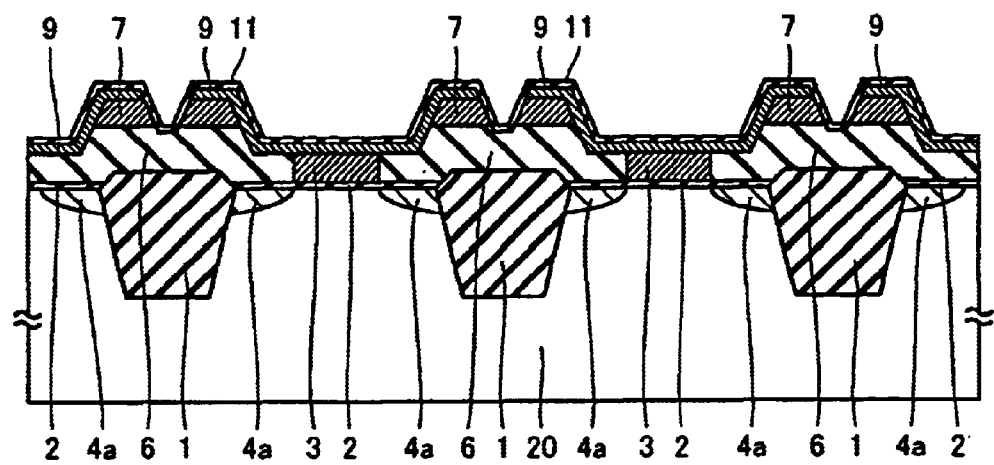
FIGS. 10 and 11 are cross-sectional views of the first and second openings in a direction parallel to the word line, in word line formation etching of memory cell portion, in first embodiment according to the present invention.

Referring next to FIG. 10, the surface of exposed second floating gate electrode 7 and third floating gate electrode 9 are cleaned through HF treatment, and insulating film 11 composed of stacked films of oxide film, nitride film and oxide film is deposited with CVD. This insulating film 11 is a so-called ONO film in non-volatile semiconductor devices. Insulating film 11 composed of ONO film is then annealed in oxygen atmosphere.

Though not illustrated, photoresist mask having an opening only in the peripheral circuit region is then formed. Using this photoresist mask, insulating film 11 in the peripheral circuit region, and third, second and first p-doped amorphous silicon films 9, 7, 3 deposited to form third floating gate electrode 9, second floating gate electrode 7 and first floating gate electrode 3 are sequentially etched away.

In addition, though not illustrated, using photoresist mask having an opening only in the peripheral circuit region, gate insulating film 2 in the peripheral circuit region is etched away with HF solution to expose the surface of silicon substrate 20 in the peripheral circuit region. Photoresist mask is then removed with $H_2SO_4/H_2O_2$ solution (sulfuric acid/hydrogen peroxide mixture) and the like. Moreover, after the surface of silicon substrate 20 is cleaned with hydrofluoric acid solution (HF solution), thermal oxide film to be a gate oxide film is formed to a thickness of 20 nm in the peripheral circuit region.

Referring again to FIG. 1, phosphorus-doped amorphous silicon film 12 constituting a control gate electrode is deposited to a thickness of approximately 100 nm on the entire upper surface of silicon substrate 20, and tungsten silicon film 13 is deposited to a thickness of approximately 100 nm on the entire upper surface of phosphorus-doped amorphous silicon film 12. Second interlayer insulating film 14 composed of TEOS film is then deposited on tungsten silicon film 13 to a thickness of approximately 220 nm with CVD.

The peripheral circuit gate and word lines in the memory cell portion are patterned with photoresist. After this photoresist is used as a mask to dry etch TEOS film 14, the resist is removed. Further, using the patterned TEOS film 14 as a mask, tungsten silicon film 13 in the memory cell and peripheral circuit portions and amorphous silicon film 12 thereunder are anisotropically etched. Thus, a semiconductor device with a cross-sectional shape shown in FIG. 10 is obtained. In a process shown with a cross-section of FIG. 10, after deposition of phosphorus-doped amorphous silicon film 12 and tungsten silicon film 13, both of the above and TEOS film 14 will be removed. As a result, a structure with a cross-section shown in FIG. 10 is obtained. FIG. 10 is a cross-sectional view of an opening formed in a word line in the structure with a cross-section shown in FIG. 1. The structure of the word line portion remains the same as shown in FIG. 1.

Figure 11:
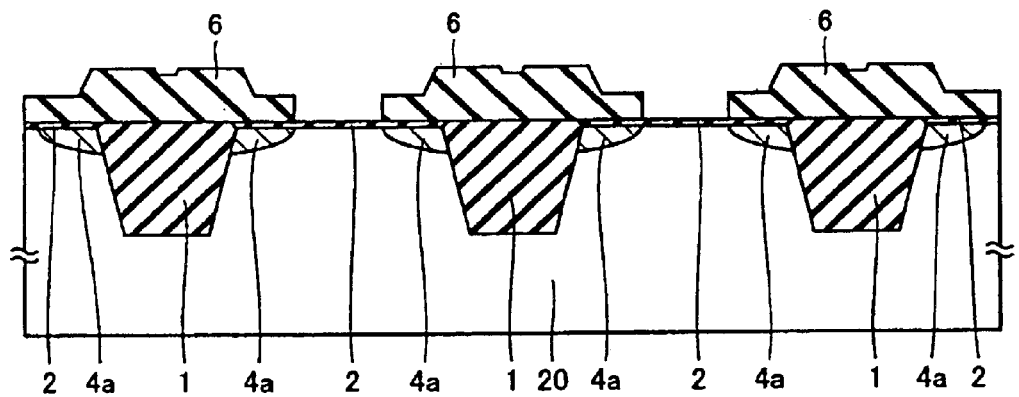

Next, after forming a photoresist film of a pattern which has only the memory cell portion opened, using previously patterned TEOS film 14 as a mask, ONO film 11 between one word line and another is removed through anisotropic dry etching. Further, through anisotropic dry etching, third and first amorphous silicon films 9, 3 stacked between word lines and stacked third and second amorphous silicon films 9, 7 are removed respectively. Thus, a semiconductor device with a cross-sectional shape shown in FIG. 11 is obtained. FIG. 11 is a cross-sectional view of an opening formed in a word line in the structure with a cross-section shown in FIG. 1. The structure of word line portion remains the same as shown in FIG. 1.

Subsequently, after the resist film covering the peripheral circuit region is removed, residue of the first amorphous silicon film in the memory cell portion, which was left on the bottom of the boundary of thick insulating film 6 on the diffused layer and first gate 3 and could not be removed completely in the previous dry etching, is removed through wet etching with dilute ammonia solution. In the conventional dry etching process, for first amorphous silicon film 3 surrounded by thick insulating film 6, residue was likely in the bottom portion of thick insulating film 6, because the upper portion thereof is likely to form "eaves" when the shape of first gate is slightly forward-tapered, as shown in FIGS. 12A and 12B.

However, dilute ammonia solution is a liquid and thus effective to reach and etch even a portion which is hidden behind and to which etching plasma is not readily introduced. Thus, polysilicon residue in such portions can be removed without any problem.

Figure 12A:
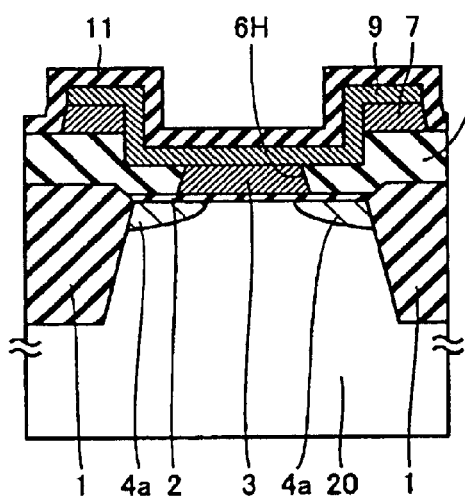
FIGS. 12A and 12B are cross-sectional views of the openings in a direction parallel to the word line, showing a problem in word line formation etching of memory cell portion.
Figure 12B:
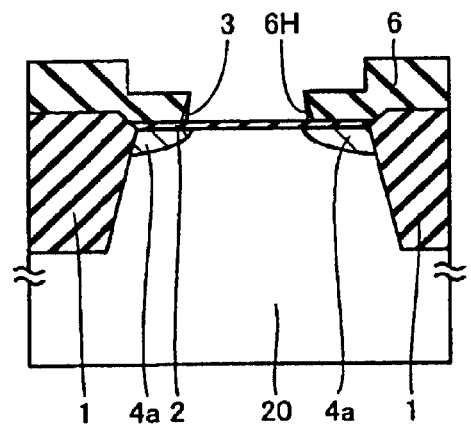

FIG. 12A is a cross-sectional view pointing out a problem in the first embodiment, and FIG. 12B is a cross-sectional view pointing out a problem where first amorphous silicon film 3 may remain as residue.

Though not illustrated, n-type impurity is then implanted into source and drain regions of an n-channel transistor in the peripheral circuit region, and p-type impurity is implanted into source and drain regions of a p-channel transistor respectively with ion implantation method. After an interlayer insulating film is deposited to a thickness of 1000 nm, holes for making contacts to each device are opened to connect circuits with a metal such as Al. Thus, a non-volatile semiconductor device in the present embodiment is completed.

(Functions and Effects)

As described above, according to the non-volatile semiconductor device and its manufacturing method in the present embodiment, by disposing the bottom surface of second floating gate electrode 7 to be higher than the upper surface of first floating gate electrode 3, three-layered structure including first floating gate electrode 3 positioned below, second floating gate electrode 7 positioned above and third floating gate electrode 9 coupling first floating gate electrode 3 and second floating gate electrode 7 can be implemented. Further by disposing first floating gate electrode 3 and second floating gate electrode 7 in positions different in a direction of height, an inclined portion can be produced in third floating gate electrode 9. Thus, contact length of the floating gate electrode with the control gate electrode is extended, and overlapping area of the floating gate electrode with the control gate electrode can be increased.

As a result, without enlarging a portion with the maximum film thickness of the floating gate electrode composed of phosphorus-doped amorphous polysilicon, sufficient overlapping area of floating gate electrode with the control gate electrode can be secured.

(Second Embodiment)

Figure 13:
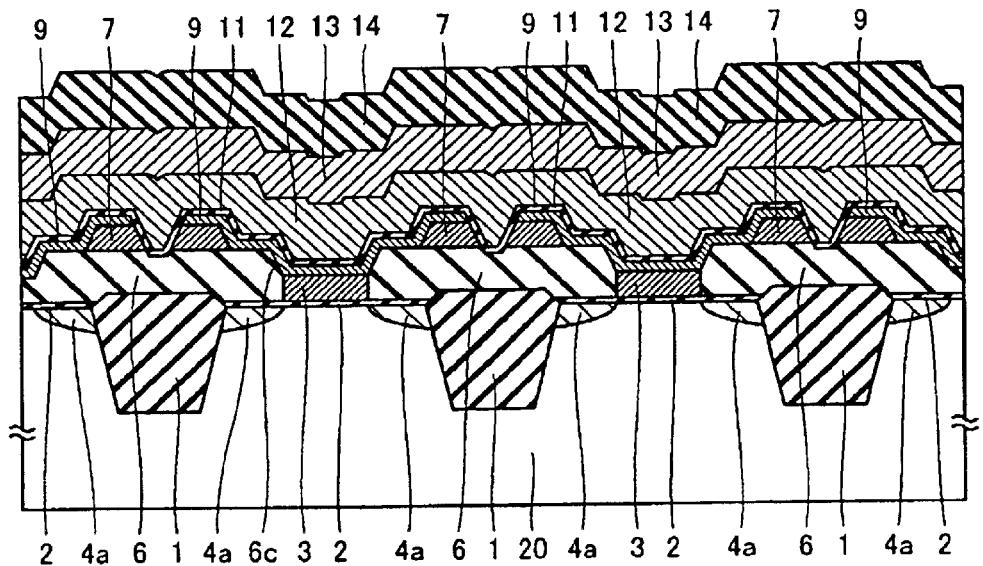
FIG. 13 is a cross-sectional view showing the structure of a non-volatile semiconductor device in second embodiment according to the present invention.
Figure 14:
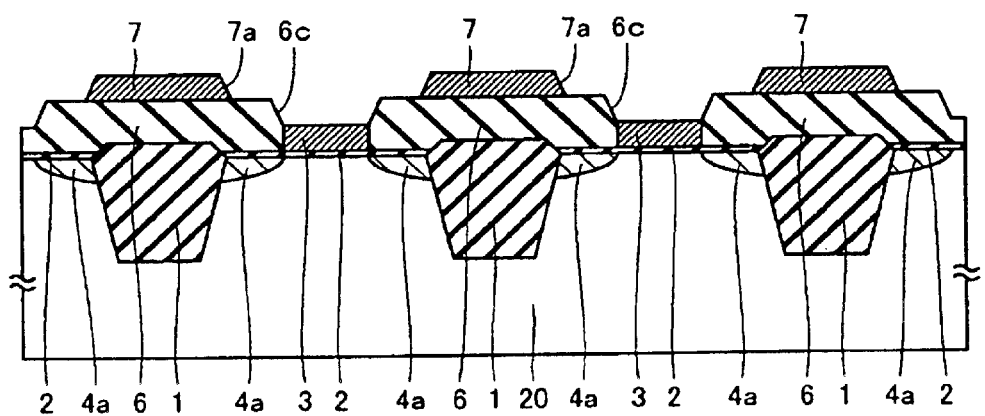
FIGS. 14 and 15 are the fifth and sixth cross-sectional views showing the steps of manufacturing the non-volatile semiconductor device in second embodiment according to the present invention.
Figure 15:
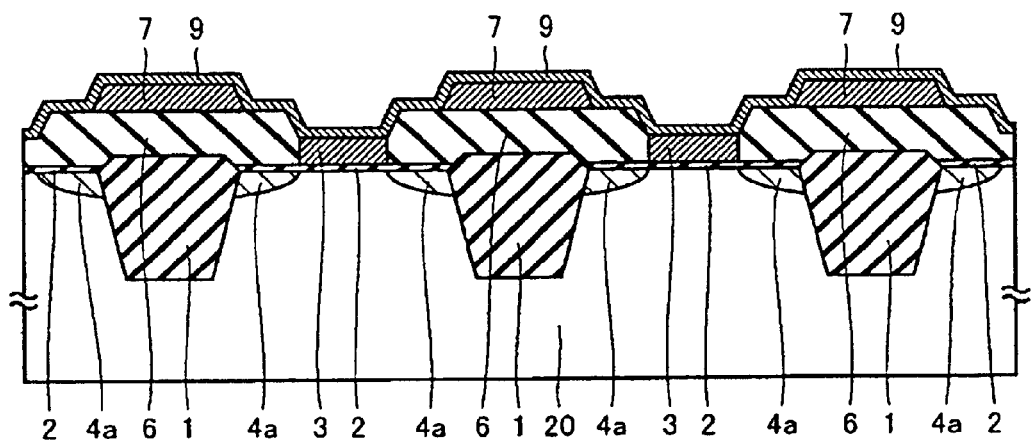

The structure of a non-volatile semiconductor device and its manufacturing method in an embodiment according to the present invention will be described with reference to FIGS. 13 to 15. A non-volatile semiconductor device in the present embodiment is an AND-type flash memory, FIG. 13 is a cross-sectional view showing the structure of the non-volatile semiconductor device in the present embodiment, and FIGS. 14 and 15 are cross-sectional views showing a manufacturing method thereof. In the following description, only the portions with characteristic structures in the present embodiment will be described. The same reference characters will be given to the identical or corresponding components in the above-described first embodiment and the detailed description thereof will not be repeated.

(Structure of Non-Volatile Semiconductor Device)

Referring first to FIG. 1, in the structure of the non-volatile semiconductor device in the above first embodiment, peripheral first interlayer insulating film 6 surrounding first floating gate electrode 3 is also positioned to be as high as the upper surface of first floating gate electrode 3. As a result, the distance between second floating gate electrode 7 and source/drain regions 4a decreases in this region to increase parasitic capacity, which may undesirably decrease the coupling ratio of the non-volatile semiconductor device. Hence, the non-volatile semiconductor device in the present embodiment is provided with a structure to solve this problem.

Referring to FIG. 13, a non-volatile semiconductor device in the present embodiment, without forming a flat surface as high as the upper surface of first floating gate electrode 3, inclined surface 6c extending from the upper end portion of first floating gate electrode 3 to the upper surface of first interlayer insulating film 6 is formed on first interlayer insulating film 6 surrounding first floating gate electrode 3. Other structures are identical to the non-volatile semiconductor device in the above first embodiment.

(Method of Manufacturing Non-Volatile Semiconductor Memory Device)

Next, a manufacturing method of a non-volatile semiconductor memory device having the above structure will be described with reference to FIGS. 14 and 15. As the steps shown in FIGS. 2 to 4 are identical to first embodiment above, the description thereof will not be repeated.

Referring to FIG. 5, using photoresist 8 as a mask, second phosphorus-doped amorphous silicon film 7 and first phosphorus-doped amorphous silicon film 3 are etched to a depth of approximately 150 nm through dry etching process. Thus, as shown in FIG. 14, second phosphorus-doped amorphous silicon film 7 in the memory cell portion is removed, and first phosphorus-doped amorphous silicon film 3 is etched by about one half of its thickness.

As a result, first floating gate electrode 3 composed of phosphorus-doped amorphous silicon film is completed. In this dry etching process, unlike in the first embodiment, an etchant of which selective etching rate for phosphorus-doped amorphous silicon film and first interlayer insulating film 6 is 5:1 or higher is used. Photoresist 8 is removed thereafter.

Thus, as shown in FIG. 14, only the first floating gate electrode 3 will be etched and first interlayer insulating film 6 is not deeply etched as in the first embodiment. Therefore, only inclined surface 6c is formed which extends from the upper end portion of first floating gate electrode 3 to the upper surface of first interlayer insulating film 6.

Referring next to FIG. 15, after the native oxide formed on first floating gate electrode 3 and second phosphorus-doped amorphous silicon film 7 is removed through HF treatment as in the first embodiment above, third phosphorus-doped amorphous silicon film 9 with a film thickness of approximately 20 nm is deposited. Subsequently, by adopting the same process as shown in FIGS. 8 to 11 indicated in the above first embodiment, a non-volatile semiconductor device in the present embodiment is completed as shown in FIG. 13.

(Functions and Effects)

Figure 16A:
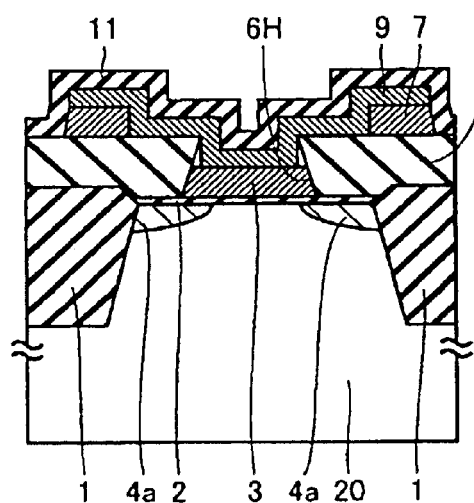
FIGS. 16A and 16B are cross-sectional views of the openings in a direction parallel to the word line, showing a problem in word line formation etching of memory cell portion.
Figure 16B:
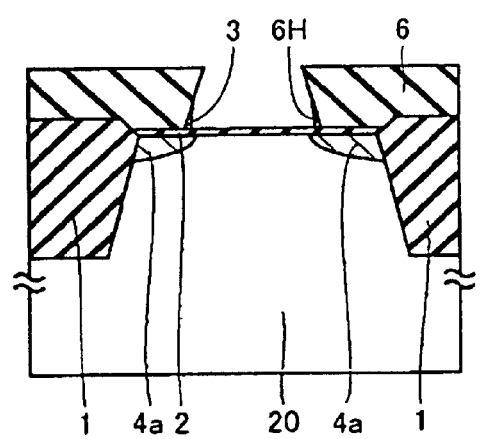
Figure 17:
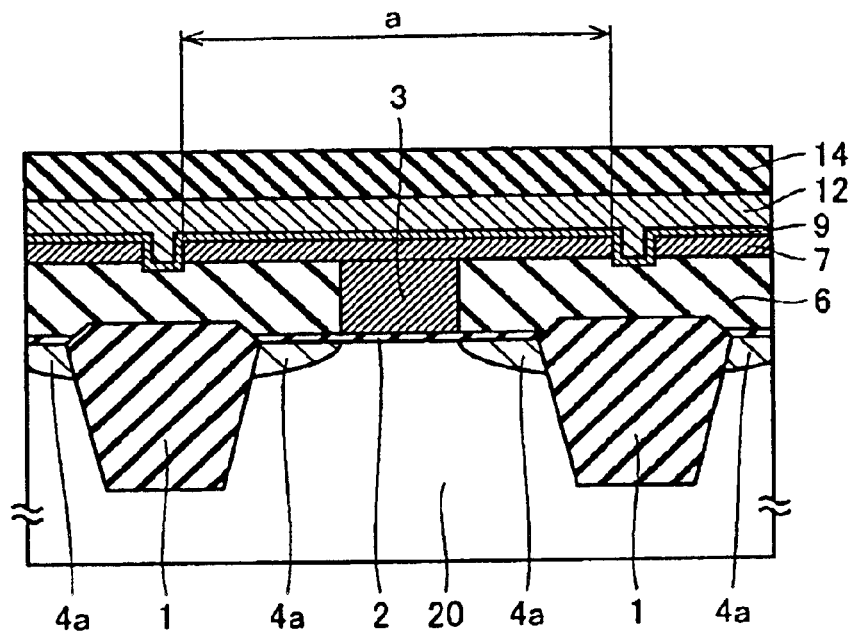
FIG. 17 is a cross-sectional view showing the structure of a first non-volatile semiconductor device in the conventional art.
Figure 18:
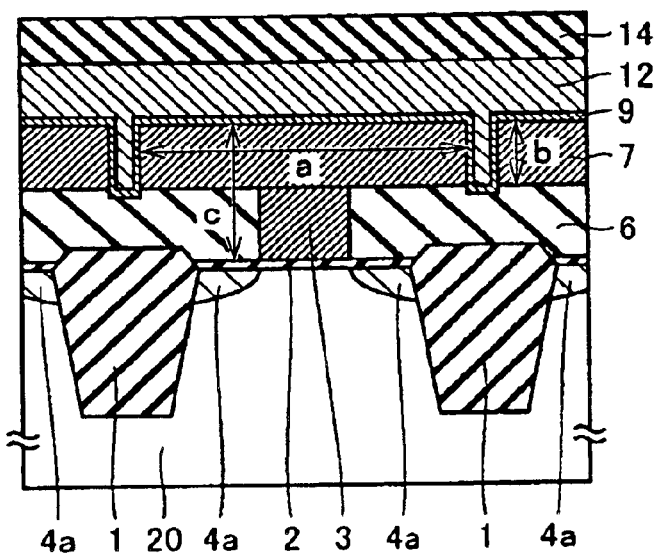
FIG. 18 is a cross-sectional view showing the structure of a second non-volatile semiconductor device in the conventional art.

As described above, according to the non-volatile semiconductor device and its manufacturing method in the present embodiment, the same functions and effects as in the above first embodiment can be obtained. In addition, the similar problems which may arise as described in FIG. 12 (see FIG. 16) can be solved in the present embodiment. Further, in the present embodiment, inclined surface 6c which extends from the upper end portion of first floating gate electrode 3 to the upper surface of first interlayer insulating film 6 is formed on peripheral first interlayer insulating film 6 surrounding the first floating gate electrode 3, and a flat surface as high as the upper surface of first floating gate electrode 3 is not formed. Therefore, the distance between second floating gate electrode 7 and source/drain regions 4a will be increased as compared with the embodiment, which in turn can prevent lowering of the coupling ratio of the non-volatile semiconductor device due to the increase of parasitic capacitance.

In each of the above-described embodiments, non-doped amorphous silicon can be used instead of first phosphorus-doped amorphous silicon film 3. Polysilicon can also be used for amorphous silicon film. In addition, even though it is amorphous silicon at deposition, it may be transformed into polysilicon through heat treatment in the subsequent process flow.

According to the non-volatile semiconductor device and its manufacturing method according to the present invention, by increasing stepped portions, overlapping area of the floating gate electrode with the control gate electrode can be dramatically increased without significantly increasing the maximum film thickness of the floating gate electrode.

In addition, in gate etching upon forming word line in the memory cell portion, where it is difficult to introduce plasma and residue of the conductive layer is likely at the bottom portion with dry etching in an opening having its periphery surrounded by interlayer insulating film and word lines, removal of residue at the bottom portion in the opening can be ensured by performing wet etching after formation of shapes through dry etching.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory device comprising:

a semiconductor substrate;

a gate insulating film provided on a main surface of said semiconductor substrate;

an interlayer insulating film provided on said gate insulating film;

a first floating gate electrode provided to be in contact with said gate insulating film and embedded in said interlayer insulating film with an upper surface only being exposed;

a second floating gate electrode provided on said interlayer insulating film;

a third floating gate electrode provided to cover said first floating gate electrode, said second floating gate electrode and said interlayer insulating film so as to electrically connect said first floating gate electrode and said second floating gate electrode;

an insulating film provided to cover said third floating gate electrode; and a control gate electrode provided to cover said insulating film;

wherein said second floating gate electrode has a bottom surface positioned to be higher than an upper surface of said first floating gate electrode.

2. The non-volatile semiconductor memory device according to claim 1, wherein said interlayer insulating film is provided with a flat surface which is substantially as high as the upper surface of said first floating gate electrode.

3. The non-volatile semiconductor memory device according to claim 1, wherein
said interlayer insulating film is provided with an inclined surface extending from an upper end portion of said first floating gate electrode to an upper surface of said interlayer insulating film.

4. The non-volatile semiconductor memory device according to claim 1, wherein
said first floating gate electrode and said second floating gate electrode are positioned spaced apart, and said third floating gate electrode is provided to establish electrical connection between said first floating gate electrode and said second floating gate electrode.

5. The non-volatile semiconductor memory device according to claim 1, wherein
said second floating gate electrode has a film thickness smaller than that of said first floating gate electrode.

6. The non-volatile semiconductor memory device according to claim 1, wherein
said third floating gate electrode is composed of silicon containing an n-type impurity.

7. The non-volatile semiconductor memory device according to claim 1, wherein
said third floating gate electrode contains a larger amount of the n-type impurity than said first floating gate electrode.

8. The non-volatile semiconductor memory device according to claim 1, wherein
said second floating gate electrode contains a larger amount of the n-type impurity than said first floating gate electrode.

9. A method of manufacturing a non-volatile semiconductor memory device comprising the steps of:
forming a gate insulating film on a main surface of a semiconductor substrate;
forming a first floating gate electrode having a periphery surrounded by an interlayer insulating film on said gate insulating film;
forming a semiconductor layer on upper surfaces of said interlayer insulating film and said first floating gate electrode;
etching said first floating gate electrode and said semiconductor layer so as to position the upper surface of said first floating gate electrode to be lower than the upper surface of said interlayer insulating film and to have said semiconductor layer left solely on the upper surface of said interlayer insulating film, and forming a second floating gate electrode with the remaining of said semiconductor layer;
forming a third floating gate electrode to cover said first floating gate electrode, said interlayer insulating film and said second floating gate electrode;
forming an insulating film to cover said third floating gale electrode; and
forming a control gate electrode to cover said insulating film.

10. The method of manufacturing a non-volatile semiconductor memory device according to claim 9, wherein
in the step of forming said second floating gate electrode, an etchant having selective etching rate 1:1 in etching said first floating gate electrode and said interlayer insulating film is used for etching said first floating gate electrode and said semiconductor layer.

11. The method of manufacturing a non-volatile semiconductor memory device according to claim 9, wherein
in the step of forming said second floating gate electrode, an etchant having selective etching rate 5:1 or higher in etching said first floating gate electrode and said interlayer insulating film is used for etching said first floating gate electrode and said semiconductor layer.

12. The method of manufacturing a non-volatile semiconductor memory device according to claim 9, wherein
said second floating gate electrode has a film thickness smaller than that of said first floating gate electrode.

13. The method of manufacturing a non-volatile semiconductor memory device according to claim 9, wherein
said first floating gate electrode, said second floating gate electrode and said third floating gate electrode are made of amorphous silicon.

14. The method of manufacturing a non-volatile semiconductor memory device according to claim 9, wherein
said first floating gate electrode, said second floating gate electrode and said third floating gate electrode are made of polysilicon.

15. The method of manufacturing a non-volatile semiconductor memory device according to claim 9, wherein
said third floating gate electrode has an impurity concentration higher than that of said first floating gate electrode.

16. The method of manufacturing a non-volatile semiconductor memory device according to claim 9, wherein
said second floating gate electrode has an impurity concentration higher than that of said first floating gate electrode.

17. The method of manufacturing a non-volatile semiconductor memory device according to claim 9, wherein
said interlayer insulating film is CVD oxide film.

18. The method of manufacturing a non-volatile semiconductor memory device according to claim 9, further comprising the steps of
forming a word line; and
removing material of said first, second and third floating gate electrode deposited in an opening formed in said word line, after which, removing material of said first floating gate electrode remaining on the bottom surface portion of said opening.

19. The method of manufacturing a non-volatile semiconductor memory device according to claim 18, wherein
dilute ammonia solution is used for removing said first floating gate electrode material remaining on the bottom surface portion of said opening.

* * * * *